United States Patent
Bittner et al.

(10) Patent No.: US 9,829,800 B2
(45) Date of Patent: Nov. 28, 2017

(54) SYSTEM CORRECTION FROM LONG TIMESCALES

(71) Applicant: Carl Zeiss SMT GmbH, Oberkochen (DE)

(72) Inventors: Boris Bittner, Roth (DE); Norbert Wabra, Werneck (DE); Martin von Hodenberg, Oberkochen (DE); Sonja Schneider, Oberkochen (DE); Ricarda Schoemer, Zusmarshausen (DE); Ruediger Mack, Langenau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 471 days.

(21) Appl. No.: 14/573,126

(22) Filed: Dec. 17, 2014

(65) Prior Publication Data
US 2015/0160562 A1    Jun. 11, 2015

Related U.S. Application Data

(63) Continuation of application No. PCT/EP2013/002077, filed on Jul. 12, 2013.
(Continued)

(30) Foreign Application Priority Data

Jul. 20, 2012    (DE) .................. 10 2012 212 758

(51) Int. Cl.
*G03B 27/68* (2006.01)
*G03B 27/32* (2006.01)
(Continued)

(52) U.S. Cl.
CPC .......... *G03F 7/706* (2013.01); *G02B 27/0043* (2013.01); *G02B 27/0068* (2013.01);
(Continued)

(58) Field of Classification Search
CPC ............ G02B 27/0043; G02B 27/0068; G03F 7/70258; G03F 7/70266; G03F 7/705;
(Continued)

(56) References Cited

U.S. PATENT DOCUMENTS

| 6,198,579 B1 | 3/2001 | Rupp |
| 2004/0179175 A1* | 9/2004 | Okada .................. G03B 27/52 355/52 |

(Continued)

FOREIGN PATENT DOCUMENTS

| DE | 19827602 A1 | 12/1999 |
| DE | 102004035595 A1 | 11/2005 |

(Continued)

OTHER PUBLICATIONS

German Office Action, with translation thereof, for corresponding DE Appl No. 10 2012 212 758.5, dated Feb. 21, 2013.
(Continued)

*Primary Examiner* — Christina Riddle
(74) *Attorney, Agent, or Firm* — Fish & Richardson P.C.

(57) ABSTRACT

Aberrations of a projection lens for microlithography can be subdivided into two classes: a first class of aberrations, which are distinguished by virtue of the fact that their future size increases by a non-negligible value after a constant time duration, independently of their current size, and a second class of aberrations, which, after reaching a threshold, only increase by a negligible value after each further time duration. An adjustment method is proposed, which adjusts these two classes of aberrations in parallel in time with one another.

20 Claims, 6 Drawing Sheets necessary adjustment time *t*

| 10ms | 100 ms | 1 s | 10 s | 100 s | several days |
|---|---|---|---|---|---|
| quickly displacing manipulator | slowly displacing manipulator | radially low-resoluting, thermal manipulator | radially high-resoluting, thermal manipulator | replacing plates of Alvarez manipulator | replacing lens element or mirror |
| changing setting | deforming manipulator | changing pressure condition of the lens | replacing stops | | customizing plates of Alvarez Manipulator |
| changing the wavelength of the projection light | deflecting the Alvarez manipulator | | | | |

Related U.S. Application Data

(60) Provisional application No. 61/673,770, filed on Jul. 20, 2012.

(51) Int. Cl.
*G03F 7/20* (2006.01)
*G02B 27/00* (2006.01)

(52) U.S. Cl.
CPC .......... *G03F 7/705* (2013.01); *G03F 7/70258* (2013.01); *G03F 7/70266* (2013.01); *G03F 7/70533* (2013.01); *G03F 7/70891* (2013.01)

(58) Field of Classification Search
CPC ............. G03F 7/70508; G03F 7/70533; G03F 7/70525; G03F 7/706; G03F 7/70883; G03F 7/70891
USPC ............... 355/30, 52, 53, 55, 67–71, 77; 250/492.1, 492.2, 492.22, 492.3, 548
See application file for complete search history.

(56) References Cited

U.S. PATENT DOCUMENTS

| | | |
|---|---|---|
| 2008/0246933 A1 | 10/2008 | Uchikawa |
| 2009/0231565 A1 | 9/2009 | Conradi |
| 2011/0080569 A1 | 4/2011 | Eva et al. |
| 2011/0181855 A1 | 7/2011 | Bittner et al. |
| 2011/0199884 A1* | 8/2011 | Miyasaka .......... G11B 7/13925 369/112.23 |

FOREIGN PATENT DOCUMENTS

| | | |
|---|---|---|
| DE | 102007058158 A1 | 6/2008 |
| DE | 102008042356 A1 | 4/2010 |
| EP | 851305 B1 | 4/2004 |
| EP | 1584982 | 10/2005 |
| EP | 1670041 A1 | 6/2006 |
| JP | 2003-045794 A | 2/2003 |
| JP | 2010-517279 A | 5/2010 |
| JP | 2012-503870 A | 2/2012 |
| WO | WO 2004/019128 A2 | 3/2004 |
| WO | WO 2005/078774 A | 8/2005 |
| WO | WO 2008/034636 A2 | 3/2008 |
| WO | WO 2008/037496 A2 | 4/2008 |
| WO | WO 2008/089953 A1 | 7/2008 |
| WO | WO 2009/026970 A1 | 3/2009 |
| WO | WO 2009/080279 A1 | 7/2009 |
| WO | WO 2010/034674 | 4/2010 |

OTHER PUBLICATIONS

Japanese Office Action, with translation thereof, for corresponding JP Appl No. 2015-521991, dated Dec. 15, 2015.

International Search Report for corresponding PCT/EP2013/002077, dated Feb. 13, 2014.

Korean Office Action, with translation thereof, for corresponding KR Appl No. 2015-7001513, dated Mar. 17, 2016.

* cited by examiner

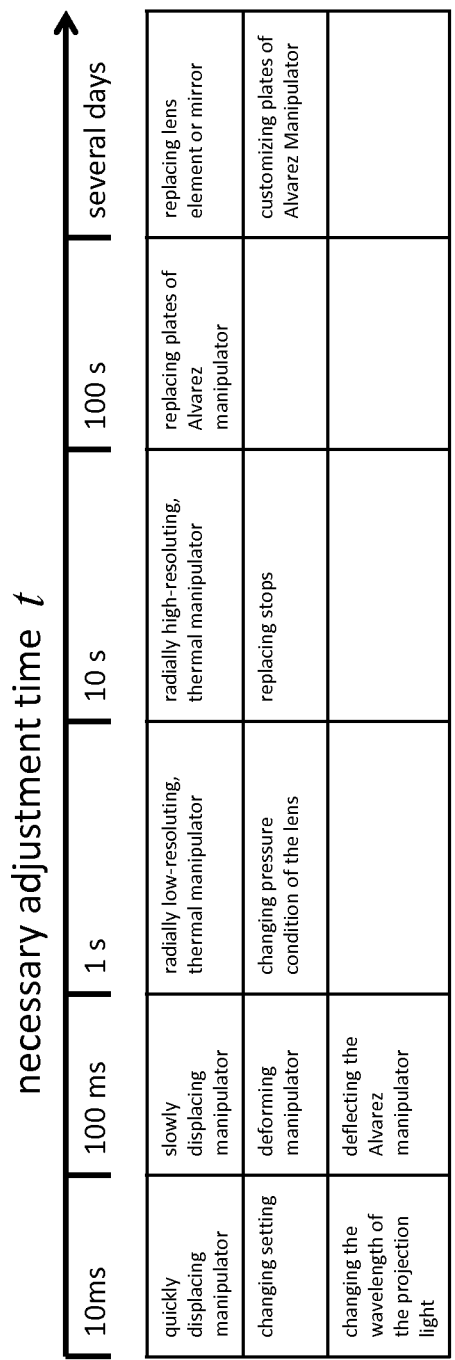

necessary adjustment time $t$

Fig. 4a

| 10ms | 100 ms | 1 s | 10 s | 100 s | several days |
|---|---|---|---|---|---|
| quickly displacing manipulator | slowly displacing manipulator | *radial niedrig auflösender, thermischer Manipulator* | radially high-resoluting, thermal manipulator | replacing plates of Alvarez manipulator | replacing lens element or mirror |
| changing setting | deforming manipulator | changing pressure condition of the lens | modifying stops | replacing stops | customizing plates of Alvarez Manipulator |
| changing the wavelength of the projection light | deflecting the Alvarez manipulator | | | | |

Fig. 4b

| 10ms | 100 ms | 1 s | 10 s | 100 s | several days |
|---|---|---|---|---|---|
| quickly displacing manipulator | slowly displacing manipulator | radial niedrig auflösender, thermischer Manipulator | *radially high-resoluting, thermal manipulator* | replacing plates of Alvarez manipulator | replacing lens element or mirror |
| changing setting | deforming manipulator | changing pressure condition of the lens | *modifying stops* | replacing stops | customizing plates of Alvarez Manipulator |
| changing the wavelength of the projection light | deflecting the Alvarez manipulator | | | | |

Fig. 4c

| 10ms | 100 ms | 1 s | 10 s | 100 s | several days |
|---|---|---|---|---|---|
| quickly displacing manipulator | slowly displacing manipulator | radial niedrig auflösender, thermischer Manipulator | *radially high-resoluting, thermal manipulator* | *replacing plates of Alvarez manipulator* | *replacing lens element or mirror* |
| changing setting | deforming manipulator | changing pressure condition of the lens | modifying stops | replacing stops | *customizing plates of Alvarez Manipulator* |
| changing the wavelength of the projection light | deflecting the Alvarez manipulator | | | | |

SYSTEM CORRECTION FROM LONG TIMESCALES

CROSS-REFERENCE TO RELATED APPLICATIONS

The present application is a continuation of, and claims benefit under 35 USC 120 to, international application PCT/EP2013/002077, filed Jul. 12, 2013, which claims benefit under 35 USC 119 of German Application No. 10 2012 212 758.5, filed Jul. 20, 2012. International application PCT/EP2013/002077 also claims priority under 35 USC 119(e) to U.S. Provisional Application No. 61/673,770, filed Jul. 20, 20012. The entire disclosure of international application PCT/EP2013/002077 is incorporated by reference herein.

The invention relates to a method for adjusting a microlithographic projection exposure apparatus.

Projection exposure apparatuses for microlithography generally consist of a light source, an illumination system which processes the light rays emitted by the light source, an object to the projected, generally called reticle or mask, a projection lens, abbreviated to lens below, which images an object field on an image field, and a further object, onto which the projection takes place, generally called a wafer. The reticle or at least part of the reticle is situated in the object field and the wafer or at least part of the wafer is situated in the image field. In general, the lens defines an optical axis in respect of which the optical elements, which belong to the lens, are arranged. In general, these optical elements are rotationally symmetric in respect of this optical axis and the optical axis is a normal to the object field and image field. In this case, the design of the lens is said to be rotationally symmetric.

If the reticle is situated completely in the region of the object field and the wafer is exposed without relative movement between wafer and image field, the projection exposure apparatus is generally referred to as a wafer stepper. If only part of the reticle is situated in the region of the object field and the wafer is exposed during relative movement between wafer and image field, the projection exposure apparatus is generally referred to as a wafer scanner. During the exposure of the wafer, the projection exposure apparatus is operated with a predetermined numerical aperture and a setting predetermined by the illumination system, for example a completely coherent or partly coherent setting, in particular a dipole or quadrupole setting. The numerical aperture is generally defined by an aperture stop of the lens. Conventional, image-side numerical apertures for microlithographic lenses are values between 0.5 and 0.6 or 0.6 and 0.7 or 0.7 and 0.8 or 0.8 and 0.9 or else greater than this. This applies to lenses which, as a last optical medium, have a gas with a refractive index of approximately 1.0.

If the region between the last optical element of the lens and the wafer is filled with a liquid as a medium, this is referred to as an immersion lens. A possible immersion liquid is water, which has a refractive index of approximately 1.43. With this, the numerical apertures specified above have to be increased by a factor of 1.43 in order to determine the associated image-side numerical apertures for immersion lenses. Hence, this results in image-side numerical apertures for immersion lenses of approximately 0.75 to 0.9 or 0.9 to 1.05 or 1.05 to 1.2 or 1.2 to 1.35 or else greater than this.

The setting is generally predetermined by optical elements of the illumination system, such as an axicon, a stop or a micromirror array or one or more interchangeable DOEs (diffractive optical elements). During the exposure, a maximum light beam, cropped by the aperture stop, reaches the image field from the object field from each field point belonging to the object field. In an ideal lens, the aberrations of which are only determined by the design of the lens, the wavefront defined by this maximum light beam, in the vicinity of the image point belonging to the field point, corresponds approximately to a spherical wave with the image point as center point. The possible resolution of such a lens is therefore determined by the orders of diffraction created at the reticle, which still pass through the aperture stop. Such lenses are therefore also referred to as diffraction limited.

The possible resolution R, which can be achieved by such a lens for microlithography, is inversely proportional to the numerical aperture NA and proportional to the work wavelength $\lambda$ of the lens and a process parameter $k_1$:

$$R = k_1 \frac{\lambda}{NA}.$$

The operating wavelength, i.e. the wavelength of the projection light, generally is 365 nm, 248 nm, 193 nm or 13.5 nm. In the case of 13.5 nm, the lens is catoptric, i.e. it consist only of mirrors. These are operated in a vacuum with numerical apertures from 0.2 to 0.25 or 0.25 to 0.3 or 0.3 to 0.4 or 0.4 to 0.45 or greater in a vacuum as surrounding medium.

Further types of microlithographic lenses are dioptric lenses, i.e. lenses consisting only of refractive lens elements, and catadioptric lenses, i.e. lenses consisting of lens elements and mirrors. Catadioptric lenses may have a usable object field which, in the case of a rotationally symmetric design, does not include the optical axis. This is then referred to as an off-axis design. This is the case in e.g. so-called RCR designs, i.e. the projection lens is subdivided into three partial lenses: a first dioptric partial lens, which images the object field onto a first intermediate image, a catadioptric partial lens, which images the first intermediate image onto a second intermediate image, and a second dioptric partial lens, which images the second intermediate image onto the image field. The catadioptric partial lens contains at least one mirror, which, due to the reversal of the propagation direction of the projection light, generally prevents the optical axis from intersecting the object field. This explains where the term off axis comes from. However, so that the object field is not too far from the optical axis, thereby making a sufficiently good correction of the aberrations more difficult, folding mirrors are situated near the two intermediate images in the catadioptric partial lens, cf. WO2004019128A2.

When operating the projection exposure apparatus with light at the operating wavelength, this results in changes in the optical elements belonging to the lens of the projection exposure apparatus which lead to partly irreversible changes in the optical properties of the lens. Listed here in an exemplary fashion are compaction, rarefaction and chemically caused changes in possible coatings of the optical elements. Further irreversible changes are created by drifts of optical elements in their mounts, which set in with increasing time. Other changes in the optical properties of the lens are of reversible nature, such as e.g. instances of lens-element heating with the change in shape of the lens elements implied thereby and the change in the distribution of the refractive index of the lens elements. This leads to time and spatially dependent changes in the optical properties of the lens.

Therefore microlithographic lenses have, over the course of their development, been complemented by an increasing number of manipulation options. These manipulation options can be used to counteract the changes in the optical properties of the lens. To this end, manipulators are employed, which displace, rotate, replace, deform, heat or cool one or more optical elements belonging to the lens, such as lens elements, mirrors or diffractive optical elements. In the case of a replacement, aspherized plane plates in particular are provided in the lens as replacement elements. Replacement elements can also be optical elements of a lens provided with manipulators. These are preferably one or more of the first and last optical elements of the lens, as seen in the light propagation direction, or one or more of the optical elements situated in the vicinity of an intermediate image of the lens or one or more of the optical elements situated in the vicinity of a pupil plane of the lens. Here, the term vicinity is defined with the aid of the so-called sub-aperture ratio. In this respect, cf., for example WO2008034636A2, which is hereby, in its entirety, incorporated into this application. Pages 41 and 42 therein are, in particular, incorporated into this application in their entirety.

Thus, for example, WO2008037496A2 discloses a lens for microlithography, which lens contains an optical element which is acted upon by a multiplicity of forces and/or torques via a manipulator such that the optical element achieves high local variability in respect of its shape.

Manipulators which deform an optical element are distinguished by their particularly quick response behavior. R. K. Tyson: Principles of Adaptive Optics, Academic Press, Inc., ISBN 0.12.705900-8 provides a general introduction to quick response manipulators for telescope mirrors. Such types of manipulators are also used within a lens for microlithography.

Thus, for example, WO2008034636A2 discloses a plane plate in a lens for microlithography. Conductor tracks to which a current can be applied are situated in or on this plane plate. During the temperature change caused thereby, it is possible to influence the refractive index of the plane plate locally, and so the plane plate has high local variability in respect of the refractive index thereof.

Thus, for example, in WO2009026970A1, the plane plate from WO2008034636A2 is provided with a heatsink, which renders it possible to keep the spatially averaged temperature of the plate constant over time.

Thus, for example, EP851305B1 discloses a pair of plane plates, so-called Alvarez plates, in a lens for microlithography. This pair of Alvarez plates has, on the surfaces of the Alvarez plates facing one another, respectively one aspherical lens element, which, in a relative zero position of the Alvarez plates with respect to one another, compensates the other in terms of optical effect. If one Alvarez plate or if both Alvarez plates is/are deflected perpendicular to the optical axis of the lens and relatively to each other, there no longer is a compensation effect and the optical effect of these Alvarez plates sets in as a manipulator.

Thus, for example, EP1670041A1 discloses a device which serves for compensating for aberrations, wherein these aberrations are, in particular, introduced into the lens for microlithography by the absorption of a dipole illumination. An optical element situated in a pupil plane of the lens experiences non-rotationally symmetric heating in the case of a dipole illumination. The optical element is exposed to additional light from a second light source, which emits light with preferably a different wavelength to that of the operating wavelength, in at least an approximately complementary fashion in relation to this heating. This compensates for undesired aberrations, or at least reduces the latter, or these are converted into different aberrations which are qualitatively different from the former aberrations. Here, a first aberration should be understood to be qualitatively different from a second aberration if the indices of the coefficients which are significantly different from zero of the series expansions of these aberrations as Zernike polynomials are pairwise different. An aberration is referred to as a scalar aberration if substantially only one index of the series expansion above differs significantly from zero. In respect of the series expansion of an aberration as Zernike polynomials, see DE102008042356A1 and DE102004035595A1.

Thus, for example, in DE19827602A1, an optical element is acted upon with heat or coldness over the circumference thereof via Peltier elements.

Such a lens for microlithography, which lens is equipped with a manipulation option, in which a manipulator acts on an optical element of the lens in the manner listed above in an exemplary fashion, can be manipulated during the operation thereof in such a way that it is possible to counteract the aforementioned changes.

Such a manipulation is referred to as an adjustment. After the projection lens is produced, it experiences a first adjustment. This is repeated after delivering the projection lens to the location at which the lithographic production should later occur, such that the projection lens can be used for production, i.e. its aberration level has dropped below a predetermined specification.

During operation and, in part even during the individual exposure processes, the projection lens experiences repeating adjustments with different numbers of manipulators which ensure that the aberration level thereof continues to remain below the specification. Without these repeating adjustments, the aberration level of the projection lens would exceed the specification, which ensures the imaging quality of the projection exposure apparatus, due to the aforementioned effects such as compaction, rarefaction, coating degradation, drift of optical elements, heating of optical elements, etc. Since this specification, as explained in e.g. DE102008042356A1, would very quickly be exceeded again without an adjustment, it is generally necessary to carry out these repeating adjustments very quickly. In so doing, e.g. maximum adjustment times of less than a second or a few milliseconds are not unusually short. In this and in the following, the adjustment time should be understood to mean the period of time which, if it is known that there is an aberration of the projection lens which has departed from the specification, is provided to return this aberration to within the specification by manipulating the optical elements of the projection lens. This period of time generally contains the steps of determining the individual manipulator deflections (solving a numerical problem) and deflecting the manipulators. In this respect, cf. DE102008042356A1 once again. Such an adjustment, which is to be carried out relatively quickly, requires some boundary conditions which distinguish it from a relatively slow adjustment compared thereto. By way of example, these boundary conditions are restrictions of the manipulator range and/or the degrees of freedom of the manipulator. By way of example, a thermal manipulator requires a longer time to reach its equilibrium state (synonymously: steady state) than a manipulator which changes the position of an optical element. Further restrictions can emerge from the available calculation time for solving the inverse problem for establishing the manipulator deflections. A quick solution of the inverse problem naturally leads to losses in the accuracy of the solution. In this respect, cf. DE102008042356A1 once again.

The aforementioned quick adjustments or short maximum adjustment times now have the effect that the slower manipulators compared to this cannot even be properly deflected. In other words: the slower manipulators may reach neither their purely design-dependent full deflection nor all their design-dependent degrees of freedom. The disadvantage of this is that, in the long-term, the projection exposure apparatus departs from the specification and becomes unavailable for the lithographic production for some time within the scope of a slow adjustment, as for example occurs in conjunction with replacing an optical element. This has clear economic disadvantages. In a worst case scenario, relatively slow manipulators are no longer even provided for installation in the projection exposure apparatus for precisely this reason, and the frequency of the downtimes is considered unavoidable.

There therefore is the need for an improved adjustment concept, which reduces the frequency of these downtimes.

It was determined that aberrations, for example the aberrations caused by the heating of optical elements of the lens, can be subdivided into two classes:

It is possible to prescribe a time duration t and a threshold p, which allows the subdivision of at least some of the aberrations relevant to the lithographic process into two classes which are dependent on t and p: a first class of aberrations, which are distinguished by virtue of the fact that, independently of their current size, their future size increases by a non-negligible value after the time duration t, and a second class of aberrations, which, after reaching the threshold p, only increase by a negligible value after each further time duration t. Here, "negligible" means that it is known a priori that, during the time duration t, the projection lens either remains within a predetermined specification or only exceeds the latter by a very small fraction of this specification at least within the time duration t, even without an adjustment, and that such an instance of exceeding does not lead to rejects only during the lithographic process.

Hence, an adjustment method is proposed, which adjusts these two classes of aberrations parallel in time, but independently of one another in respect of their temporal specifications. The proposed adjustment method contains two partial adjustments, which in turn are adjustment themselves but are referred to as partial adjustments for reasons of clarity.

The invention will be explained below on the basis of the following formulations.

Formulation 1. Method for adjusting a microlithographic projection exposure apparatus, comprising a first partial adjustment and a second partial adjustment.

The first partial adjustment containing the steps of:
(a) prescribing a first temporal adjustment duration $t_1$,
(b) establishing a first aberration $b_1$ of the projection lens,
(c) adjusting the first aberration $b_1$ during the first temporal adjustment duration $t_1$.

The second partial adjustment containing the steps of:
(d) prescribing a second temporal adjustment duration $t_2$,
(e) establishing a second aberration $b_2$ of the projection lens,
(f) adjusting the second aberration $b_2$ during the second temporal adjustment duration $t_2$, characterized in that
(g) $t_1 < t_2$,
(h) $b_1$ is an aberration which changes more quickly than $b_2$ during the adjustment duration $t_2$ and
(i) the first partial adjustment is carried out in parallel while the second partial adjustment is carried out.

According to the method as per formulation 1, two aberrations of the projection exposure apparatus are adjusted in parallel in time. The two aberrations $b_1$ and $b_2$ to be adjusted are adjusted in accordance with the speed, with which these change: the aberration changing more quickly is adjusted more quickly during a first partial adjustment than the aberration changing slowly, which is adjusted during a second partial adjustment. "Quick" and "slow" should be understood as relative to one another, both here and below. This quicker adjustability of the aberrations changing more quickly relative to the slower adjustability of the aberrations changing more slowly can be achieved in various ways: quicker manipulators are employed, the calculation accuracy for establishing the optimal deflection of the involved manipulators is set to be lower or the employed manipulators are not deflected in all of their degrees of freedom. Here, use can also be made of combinations of these three types. As a result of such "separation" of the manipulators, two aberrations can advantageously be adjusted in parallel, or it is possible to adjust aberrations $b_2$ which would not even be adjusted without the method according to formulation 1, since, for example, the adjustment time 4 would not suffice for this. In other words: only a relaxation to a longer adjustment duration $t_2$ even allows an adjustment of the aberration $b_2$ or the use of a manipulator or one of its degrees of freedom.

Formulation 2. Method according to formulation 1, characterized in that
carrying out of the first partial adjustment repeatedly while the second partial adjustment is carried out.

The method according to formulation 2 makes it possible to readjust the aberration $b_1$ following a reduction by the first partial adjustment if this aberration grows again. In the process, the second partial adjustment is not influenced.

Formulation 3. Method according to formulation 2, characterized in that
$t_1 < 100$ milliseconds or $t_1 < 20$ milliseconds applies and $t_2$ is greater than $t_1$ by at least 2, more particularly by at least 3, orders of magnitude.

The method according to formulation 3 allows an adjustment duration which is longer by at least three orders of magnitude for the second partial adjustment relative to the first partial adjustment. This ensures that the manipulators utilized in the second partial adjustment can be deflected in a significantly more optimal fashion and that more degrees of freedom can be addressed if these are present in these manipulators due to their design.

Formulation 4. Method according to formulation 2 and formulation 3, characterized in that
the first aberration $b_1$ and the second aberration $b_2$ are scalar aberrations and the order of magnitude of the second aberration $b_2$ is not greater than the order of magnitude of the first aberration $b_1$.

If the order of magnitude of the slowly changing aberration additionally is not greater or even smaller than the order of magnitude of the quickly changing aberration, it is possible to use manipulators with a smaller range for the second partial adjustment than is the case in the first partial adjustment.

Formulation 5. Method according to one of the preceding formulations, characterized in that the first aberration $b_1$ and the second aberration $b_2$ are scalar aberrations and the first aberration $b_1$ has a lower waviness than the second aberration $b_2$.

In the case of aberrations caused by heating optical elements, such aberrations with a lower waviness are primarily found amongst the quickly changing aberrations. It is therefore advantageous to adjust aberrations with a lower waviness primarily by the first partial adjustment and to adjust those with a higher waviness by the second partial adjustment. C.f. below for the definition of waviness.

Formulation 6. Method according to one of the preceding formulations 2 to 5,
characterized in that
one or more manipulators from a class of the quicker manipulators of the manipulators of the projection exposure apparatus are used during the first partial adjustment and one or more manipulators from a class of the slower manipulators of the manipulators of the projection exposure apparatus are used during the second partial adjustment.

The subdivision of a selection of manipulators of the projection exposure apparatus into the classes of relatively slow and quick manipulators in this case complies with the available adjustment times $t_2$ and $t_1$ in accordance with formulation 1. As a result of this, range and degree of freedom of the involved manipulators are advantageously employed in an improved fashion than would be the case without such a classification.

Formulation 7. Method according to formulation 6,
characterized in that
an equivalent manipulator in terms of design, in particular a thermal manipulator, is used both during the first partial adjustment and during the second partial adjustment.

Depending on the actuation, a thermal manipulator can bring about the adjustment of an aberration relatively slowly or relatively quickly. Therefore it is possible for such a manipulator to be used in both partial adjustments by virtue of different actuations.

Formulation 8. Method according to formulation 7,
characterized in that
the manipulator is used with a greater accuracy setting during the second partial adjustment than during the first partial adjustment.

The thermal manipulator according to formulation 8 has, in the case of its assignment as manipulator for the second partial adjustment, a longer adjustment time $t_2$ available than when it is assigned to the first partial adjustment. It can therefore be operated with a higher accuracy setting when associated with the former, allowing for an improved adjustment of the aberration $b_2$. Here, the accuracy setting is understood to mean the accuracy of the algorithm which is used to calculate the manipulator deflection. The accuracy of an algorithm is set in this case by an a priori error estimate.

Formulation 9. Method according to one of the preceding formulations,
characterized in that
a first algorithm is used for determining manipulator travel for the first partial adjustment, a second algorithm is used for determining manipulator travel for the second partial adjustment and the first algorithm has a quicker run time or a lower accuracy than the second algorithms with high accuracy.

The longer adjustment duration $t_2$ available for the second partial adjustment allows the use of a more accurate algorithm, without having to take the run time thereof into account. As a result, it is possible, as in formulation 8, to achieve an increased accuracy setting during the second partial adjustment. Independent of the accuracy setting, the second partial adjustment can possibly also achieve a greater reduction in the second aberration $b_2$ than would be possible by an application of the first partial adjustment on the second aberration $b_2$. By way of example, cf. the algorithms mentioned in DE102008042356A1, such as simulated annealing and evolutionary (e.g. genetic) algorithms. Those are examples of algorithms with high accuracy.

Formulation 10. Method according to one of the preceding formulations,
characterized in that
the first and/or the second aberration is/are established by a measurement or a prediction from a prediction model.

If the aberrations $b_1$ and $b_2$ are merely measured in the interval of the second partial adjustment, the development of the first aberration $b_1$ after the end of the first partial adjustment can be corrected by a prediction according to formulation 10, since the first aberration has changed both due to the first partial adjustment and as a result of its quick changeability. If the aberration $b_1$ is measured in the interval of the first partial adjustment, it is advantageous to model the development of the second aberration by a prediction model. As a result, the second aberration can also be adapted to the value to which it has most likely developed and a second partial adjustment can be organized accordingly.

FIG. 2 shows the one assignment of manipulators and adjustment times

Figure 1:
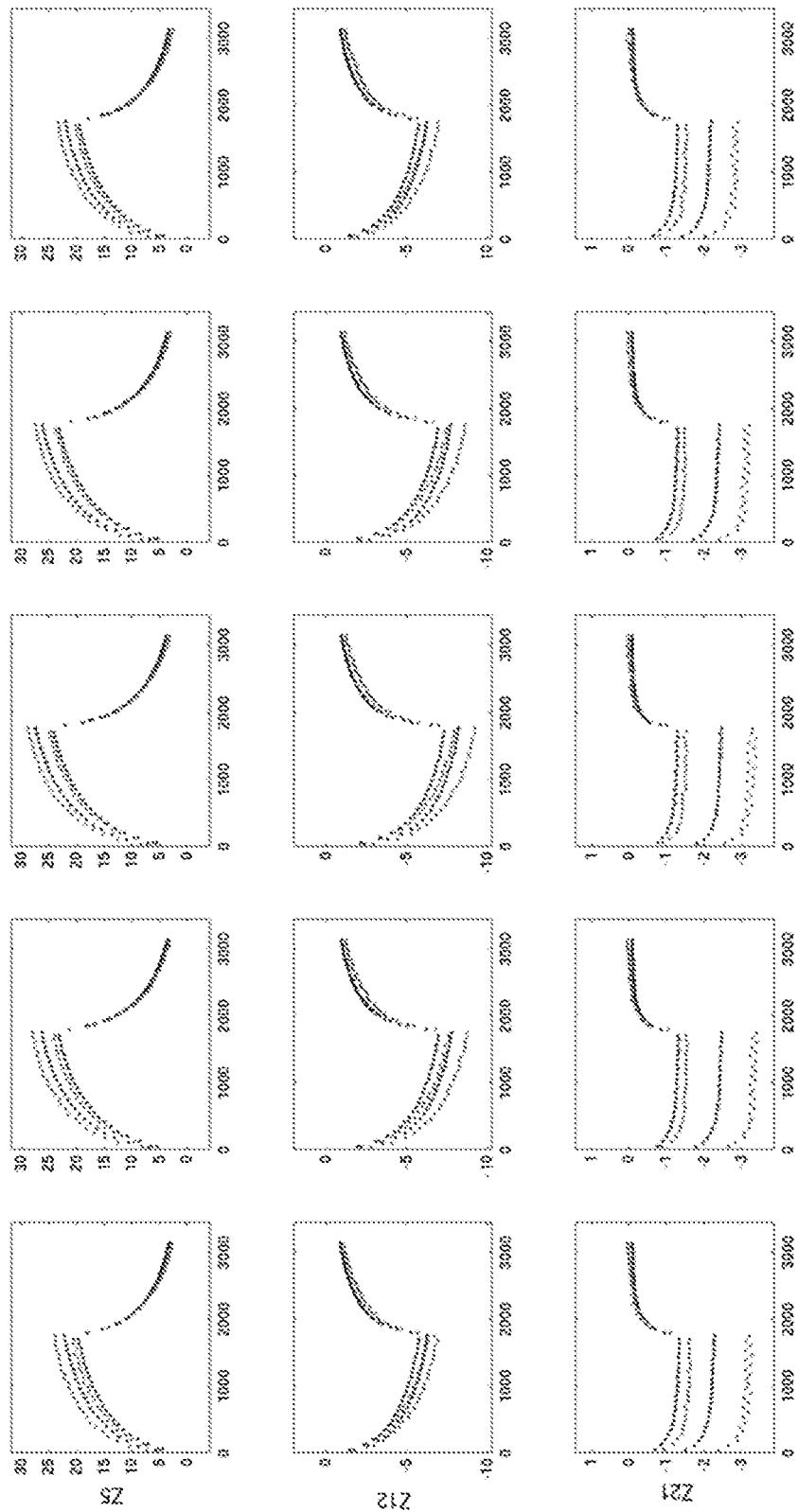
FIG. 1 shows the temporal behavior of various aberrations
Figure 5:
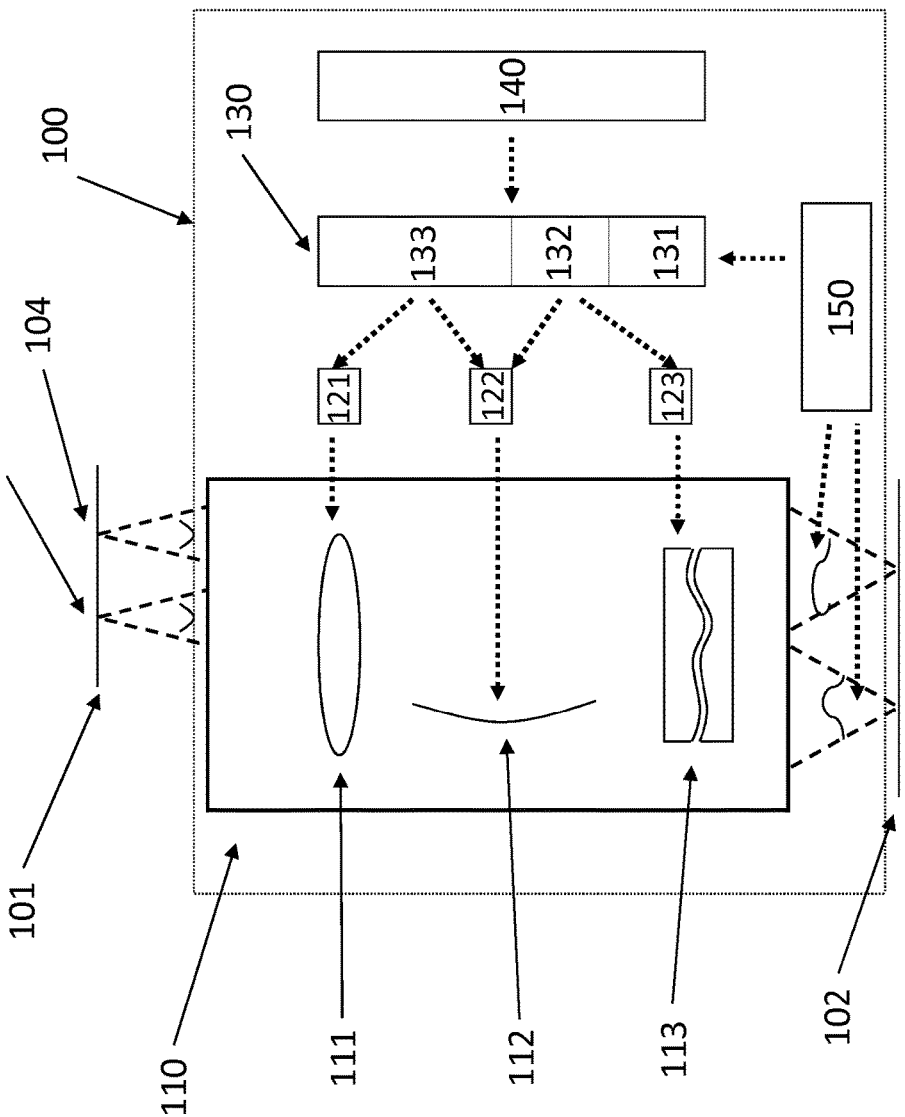
Figure 6:
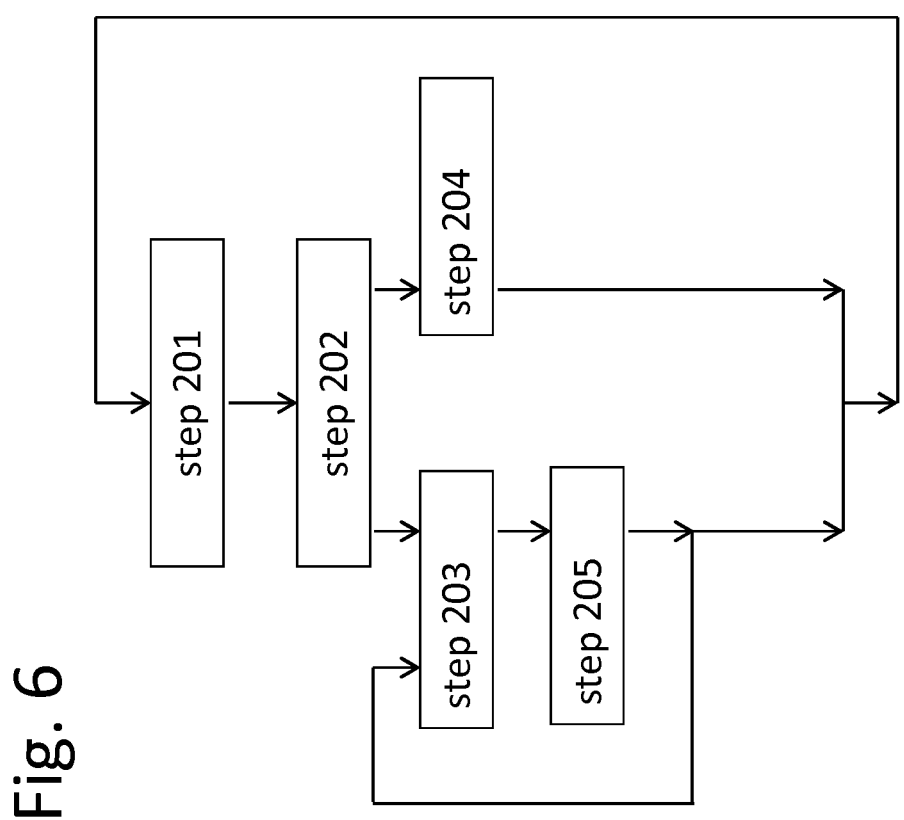

FIG. 3a-d show explanations of relatively quick and relatively slow, thermal manipulators FIG. 4a-c show subdivisions into relatively quick and relatively slow manipulators FIG. 5 shows a lens with the regulation unit for the parallel first and second partial adjustment FIG. 6 shows a flowchart of the parallel first partial adjustment and second partial adjustment FIG. 1 illustrates the typical time profile of some aberrations, which are generated by the heating experienced by the optical elements of the lens as a result of the absorption of projection light. The lens is a catadioptric lens, designed for scanning operation, with an extent of the image field of 25 mm orthogonal to the scanning direction. The temporal aberration profiles for three Zernike coefficients, Z5, Z12 and Z21, are compared; cf. DE102008042356A1 and DE102004035595A1 for the definition of the Zernike coefficients. The three Zernike coefficients in the three illustrated rows are three astigmatic terms with (radial) waviness R of second, fourth and sixth order, increasing from Z5 to Z21, and constant azimuthal waviness θ of second order, wherein (R, θ) are the normalized pupil coordinates. To be more precise: $Z5=\sqrt{6}R^2 \cos 2\theta$, $Z12=\sqrt{10}(4R^2-3)R^2 \cos 2\theta$, $Z21=\sqrt{14}(15R^4-20R^2+6)R^2 \cos 2\theta$. The diagrams, respectively situated five in a row, correspond to a subdivision into five equidistantly distributed field points orthogonal to the scanning direction.

The general definition of Zernike polynomials and their coefficients can be taken from Herbert Gross, ed., *Vol. 1: Fundamentals of Technical Optics*, Wiley, 2005. Each Zernike polynomial p depends from an radial argument r and an azimuthal argument φ and is given by a product $p(r, \phi)=p_1(r) \cdot p_2(\phi)$ consisting of a radial factor $p_1$ which is a polynomial and an azimuthal factor $p_2$ which is a trigonometric polynomial. Both polynomials, respectively, depending from the radial argument r and azimuthal argument φ only. The radial and azimuthal waviness of the Zernike polynomial p is given by the polynomial order of the radial factor $p_1$ and the polynomial order of the azimuthal factor $p_2$, respectively. A Zernike polynomial p is said to have higher radial waviness than a Zernike polynomial q provided that the radial factor of p has a higher polynomial order than the radial factor of q. A Zernike polynomial p is said to have higher azimuthal waviness than a Zernike polynomial q provided that the azimuthal factor of p has a higher polynomial order than the azimuthal factor of q. A Zernike polynomial p is said to have higher waviness than a Zernike polynomial q provided that p has a higher radial waviness than q and the azimuthal waviness of q is not greater than that of p or p has a higher azimuthal waviness than q has and the radial waviness of q is not greater than that of p.

The respective individual diagrams show the temporal developments of the corresponding Zernike coefficient at the relevant field point of the image field. Respectively one simulation value and one measured value are depicted for two different projection lenses. In each image, FIG. 1 respectively shows five measured profiles from five different lenses.

The abscissa is plotted in seconds and the ordinate is plotted in nanometers. The function values correspond to the amplitude (or synonymously the value) of the corresponding Zernike coefficient in the series expansion of the deviation of the wavefront from a spherical wave according to Zernike polynomials as illustrated in DE102008042356A1 and DE102004035595A1.

Thus, for example, the first diagram in the first row shows the temporal development of the aberration Z5 at the outermost left-hand field edge. The loading case is an actuation of the projection lens with projection light an operating wavelength of 193 nanometers, the setting of a 35° Y-dipole and with a ratio of sigma-in to sigma-out of 0.7-0.9. In approximately the first 1800 seconds, the amplitude of initial value defined as a zero point increases like a root function up to an amplitude of approximately 25 nm. The actuation with projection light ends after these 1800 seconds and the optical elements cool down again, leading to a decay of the amplitude.

It is possible to gather from the first row that the behavior of Z5 is relatively independent of the observed field point.

If the aberrations in the second and then in the third row of FIG. 1 are observed, the temporal developments are likewise seen to be approximately independent of the observed field point. However, the shape of the increase (in terms of absolute value) is less steep and transitions more quickly into saturation with ultimately smaller amplitude (in terms of absolute value).

In general, it is possible to determine that the aberrations or Zernike coefficients with a higher (radial) waviness, such as e.g. Z21, exhibit, compared to an aberration with a lower (radial) waviness, such as e.g. Z5, a behavior of, in relative terms, lower amplitudes (in terms of absolute value) and of reaching saturation more quickly.

If, within the scope of operating a projection exposure apparatus, a comparison is made between the period of time of actuating the lens with projection light and the heating accompanying this and the time without actuating the lens with projection light and the cooling accompanying this, then this ratio is significantly greater than one. Thus, in general, it is the case in all three aberrations Z5, Z12 and Z21 that the amplitudes thereof have grown so far after a certain amount of time that, without an adjustment, the lens would depart from the specification.

In general, such a specification is provided by upper limits for aberrations such as the three aforementioned Zernike coefficients Z5, Z12, Z21. Such an adjustment is therefore prescribed to be repeating and the repetition is prescribed with a high frequency. In this respect, cf. DE102008042356A1. Here, the available adjustment time can be several seconds to a few milliseconds. The predetermined frequency for the adjustment is set by the fastest-growing aberration. This is Z5 in FIG. 1. From the view of this frequency predetermined thereby, (radial) higher-order aberrations, such as e.g. Z21, exhibit the behavior of an initial strong increase with subsequently negligible growth in relation to the specification. An aberration such as Z21 so to speak changes its behavior.

The aberration Z5 will therefore be adjusted in each adjustment cycle since it continuously threatens to depart from the specification. Initially, the aberration Z21 will likewise have to be adjusted with the same frequency or a frequency of the same order of magnitude as the aberration Z5. However, after approximately 100 seconds, the growth in the amplitude of Z21 is so small that this growth remains within the scope of the specification. Then, as seen relative to Z5, the aberration Z21 becomes a slowly changing aberration.

The aberrations can therefore generally be divided into two classes, defined relative to one another, of quickly changing and slowly changing aberrations. This subdivision can change in respect of time and with respect to the maximum predetermined adjustment time. By way of example, the classification of the aberration Z12 depends precisely on these two parameters and the predetermined specifications.

This different behavior of the aberration growth now results in the following problem: if use is always made of the same adjustment concept with a high frequency, the class of slowly changing aberrations will be largely ignored by the adjustment algorithm for such a long time until the amplitudes thereof threaten to violate a specification. In such a situation, the predetermined adjustment algorithm is then forced, within its predetermined, possibly very short maximum adjustment time, to also adjust the slowly changing aberration Z21, which has now departed from the specification, in addition to the quickly changing aberration Z5. In general, an adjustment algorithm addresses all errors at the same time. However, if the relatively quickly changing Z5 is once again dominant in the meantime, the adjustment may continue to ignore the aberration Z21. However, the problem is that, in particular, the (radial) higher-order Zernike coefficients resist a fast adjustment. This will now be explained.

The manipulation options, mentioned at the outset, of the optical elements of the projection exposure apparatus and, in particular, of the lens can likewise be subdivided into classes.

FIG. 2 shows such a class subdivision using an illustrative selection of manipulator types. Manipulators which displace an optical element of the projection lens relative to other optical elements of the projection lens can generally be employed for adjustment times of 100 milliseconds. Depending on the actuation of such a displacing manipulator, it is also possible to achieve adjustment times of 10 milliseconds. However, this is generally to the detriment of the accuracy of the deflection of the manipulator or to the detriment of the possible deflection of the manipulator relative to the accuracy. Thus, it is still possible to use a control loop in the case of 100 milliseconds, but is dependent on pure control in the case of 10 milliseconds. Thus, a displacing manipulator can satisfy different maximum adjustment times while having the same design, dependent on its closed-loop or open-loop control.

An Alvarez manipulator, as shown in EP851305B1, can be deflected within an adjustment time of 100 milliseconds. However, if the plate pair of the Alvarez manipulator should be replaced, cf. e.g. DE102007058158A1, this may require an adjustment time of 100 seconds. Such an Alvarez manipulator can therefore likewise be categorized into two classes: a first class, in which the Alvarez manipulator can quickly be deflected and has one degree of freedom, which is given by the relative position of its two plates in relation to one another, and a second class, in which the plate pair of the Alvarez manipulator is replaced by an alternative pair and this alternative pair is then deflected relative to its parts. In the first class, the Alvarez manipulator has one degree of freedom; in the second class, the Alvarez manipulator has as many degrees of freedom as there are plate pairs available for replacement.

Such an Alvarez manipulator can also, in accordance with the demands of a customer, be provided with a plate pair yet to be produced (customization). This then requires an adjustment time of several days. The degrees of freedom of such customization are then merely determined by the position of the Alvarez manipulator in the projection lens.

FIGS. 3a-3d explain the temporal behavior of a thermal manipulator as described in WO2009026970A1. This is a plane plate (2) pervaded by wires (1) in the horizontal and vertical direction, which wires are numbered from 1 to 16 and numbered from R1 to R16, respectively. A resistance density is applied to the wires and the latter can be actuated with different voltages at the ends (3) thereof. The optical effect is brought about by the local change in the refractive index of the plane plate accompanying the temperature change. In order to be able to set a zero deflection of this thermal manipulator, the latter is provided with a heatsink, such as e.g. a continuously cooling airflow. The latter is not illustrated here.

FIGS. 3a-3d show the plane plate from the direction in which the projection light passes through the plane plate.

For simplifying the illustration, the assumption is made here and shown that the heat actuation of each individual one of the illustrated pixels can be addressed in isolation from the others.

Figure 3A:
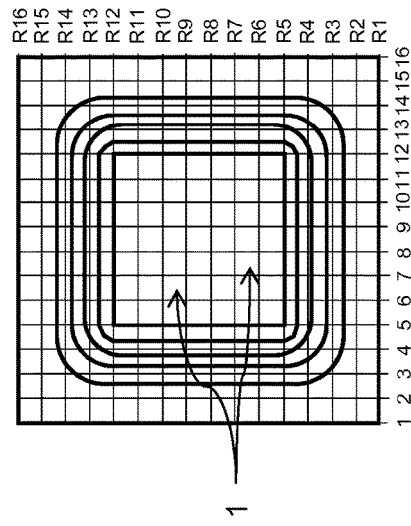

FIG. 3a shows the temperature distribution in the plate one second after a constant, continuous heat actuation of the pixels (4) with the coordinates [5, 12]×[R5, R12]. What is shown here are an inner region and an outer region with pixels in each case having a common temperature, and, compared thereto, a very narrow intermediate region with a temperature gradient.

Figure 3B:
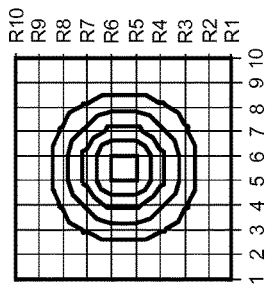

FIG. 3b shows the equilibrium state for the same actuation, which is achieved after approximately five seconds. The temperature in the inner region of the plane plate has remained unchanged, the outer region with the temperature gradient has become wider, but it will no longer change as long as the heat actuation remains unchanged. Overall, in the equilibrium state, the same amount of heat dissipates from the whole plane plate (2) as is added by the pixels (4) actuated by heat.

Figure 3C:
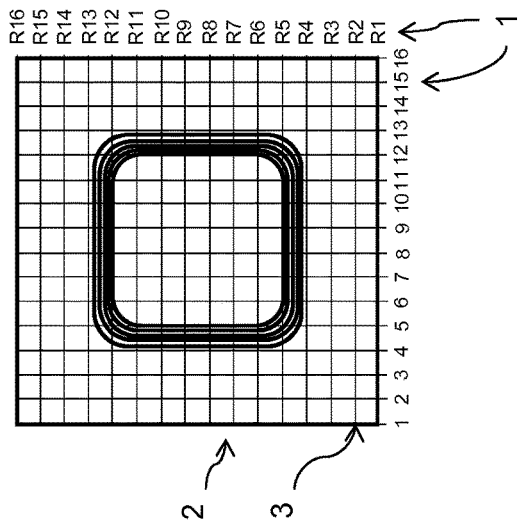
Figure 3D:
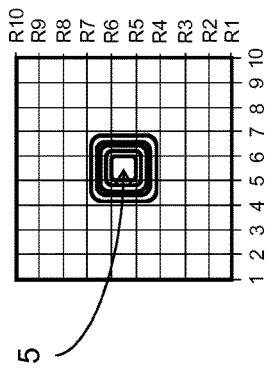

FIGS. 3c and 3d show the behavior if the heat actuation is selected in such a way that an individual pixel (5) with the coordinates [5, 6]×[R5, R6] now experiences a different heat actuation compared to its neighbors.

Since the change in the refractive index of the plane plate (2) in a small region depends strictly monotonically on the change in the temperature, the temperature differences of the plane plate (2) for small temperature differences can be seen as being proportional to a phase error of the wavefront. Hence, the equilibrium state achievable as per FIG. 3b can be considered to be a first manipulator degree of freedom of a thermal manipulator and the equilibrium state achievable as per FIG. 3d can be considered to be a second manipulator degree of freedom of this thermal manipulator.

If an adjustment time of five seconds or more is scheduled, this thermal manipulator has the degrees of freedom corresponding to FIGS. 3b and 3d.

However, if an adjustment time of e.g. at most one second is scheduled, the degree of freedom in accordance with FIG. 3d cannot be achieved. By contrast, the temperature difference between FIGS. 3a and 3b appears to be qualitatively relatively low and one is inclined to tolerate the corresponding phase difference and to consider the degree of freedom in accordance with FIG. 3b to belong to this thermal manipulator with its adjustment time of one second. Quantitatively, this initially qualitative point of view is expressed by virtue of the fact that the ratio of the area of pixels with constant temperature to the area of pixels which experience a temperature change is significantly lower in the case of FIGS. 3a and 3b than in the case of FIGS. 3c and 3d.

The actuation of a smaller region of the plane plate (2) with heat generally results in a higher waviness of the corresponding phase error.

It is therefore possible to say that a thermal manipulator belongs to two classes: a class of relatively quick manipulators if the manipulator should bring about wavefront changes with low waviness and a class of relatively slow manipulators if the manipulator should additionally bring about wavefront changes with high waviness.

In FIGS. 4a-4c, the above-discussed classifications of the aberrations and manipulators are carried out in an exemplary fashion as partial adjustments carried out in parallel. FIGS. 4a-4b illustrate a first partial adjustment and a second partial adjustment carried out in parallel thereto.

The first partial adjustment in accordance with FIG. 4a should address those aberrations $b_1$ which threaten to depart from the specification within 1 s as a result of the heating of the lens connected to the actuation with projection light. By way of example, for a specification of 5 nm, this is the astigmatism $b_1=Z5$, which leads to an aberration Z5 of more than 5 nm directly with the start of the actuation. In this respect, cf. once again FIG. 1. Hence, an adjustment time of $t_1=1$ s is provided in this first partial adjustment. The manipulators utilized in the first partial adjustment are highlighted in FIG. 4a via a bold type. These are slowly displacing manipulators, changes in the setting, changes in the wavelength of the projection light, deforming manipulators, the deflection of an Alvarez manipulator, low-resolution, thermal manipulators and a change in the pressure conditions in the lens.

The second partial adjustment in accordance with FIG. 4b should address those aberrations $b_2$ which threaten to depart from the specification within 100 s as a result of the heating of the lens connected to the actuation with projection light. By way of example, for a specification of 5 nm, this is the astigmatism $b_2=Z12$, which threatens to exceed an amplitude of 5 nm after approximately 100 s. In this respect, cf. once again FIG. 1. Hence, an adjustment time of $t_2=100$ s is provided in this second partial adjustment. The utilized manipulators are slowly displacing manipulators, changes in the setting, a change in the wavelength of the projection light, deforming manipulators, the deflection of an Alvarez manipulator, high-resolution, thermal manipulators, a change in the pressure conditions in the lens and a change of the stop of the lens.

As a second example, FIGS. 4b-4c now illustrate a first partial adjustment and a second partial adjustment carried out in parallel thereto.

The first partial adjustment corresponds to the aforementioned second partial adjustment and addresses the corresponding aberrations and specifications. The second partial adjustment now addresses aberrations with a very high waviness, which generally can no longer be compensated for by manipulators which are fixedly installed into the projection lens. By way of example, this includes the compaction of optical materials such as glass or layers, mentioned at the outset, if these are impinged upon by projection light. This impingement can be of a very local nature if, for example, a so-called free-form setting is employed. In this respect, cf. WO09080279A1 or Illumination Optics for Source-Mask Optimization, Mizunoi, et al., Nikon Corp., 201-9 Miizugahara, Kumagaya, Saitama, Japan 360-8559. In this case, the second partial adjustment contains a replacement or post-processing of an optical element of the projection lens such as e.g. the stop, a lens element, a mirror or one or more aspherized plane plates. At the time of such replacement, a parallel first partial adjustment no longer makes sense. The parallel nature of first and second partial adjustment in this second example should be understood in such a way that the slowly growing aberration $b_2$ is compensated for by the continuously operating manipulators from FIG. 4c. At first glance, there does not appear to be a difference from the manipulators printed in bold type in FIG. 4b, but one should consider that the predetermined adjustment times are different and different aberrations are compensated for. Thus, for example, the manipulator which influences the setting will, in the partial adjustment in accordance with FIG. 4b, compensate for an aberration, caused by heating of optical elements near the pupil, with a relatively high intensity and a low resolution. However, the same manipulator will, in the partial adjustment in accordance with FIG. 4c, address an aberration caused by layer degradation with a relatively low intensity and a high resolution.

FIG. 5 has in part been taken from FIG. 1 of DE102008042356A1.

FIG. 5 shows an exemplary embodiment of a projection exposure apparatus 100 for microlithography for imaging an object field 101 onto an image field 102. The projection apparatus 100 contains a lens 110. Two field points 103 and 104 situated in the object field, which are imaged in the image plane 102 by the lens, are illustrated in an exemplary manner. The beam path is delimited by a stop, which is situated in the vicinity of a pupil plane of the lens.

The lens contains optical elements such as lens elements 111, mirrors 112 and plane plates 113. A manipulator 121 acts on one of the lens elements, which manipulator can displace, bend, heat and/or cool the lens elements or can locally heat a plane plate, as discussed above, with a high or low resolution. A second manipulator 122 acts on the mirror 112 in the same manner and a third manipulator 123 serves for replacing an individual plane plate (not illustrated here) with a further individual plane plate (likewise not illustrated here), which is aspherized. Alternatively, this third manipulator can be an Alvarez manipulator 123 with replaceable plate pairs 113, or a manipulator which changes stops or manipulates the stop shape or the stop diameter.

Light beams which are subsequently restricted by the stop are emitted by the two field points 103 and 104. The outermost rays of which light beams are illustrated here in a dashed manner. These outermost rays delimit the wavefronts respectively belonging to the field points 103 and 104. For the purposes of illustrating the invention, these wavefronts are assumed to be spherical. A wavefront sensor and/or further sensors and/or a prediction model form(s) a determination unit 150, which supplies information in respect of aberrations established from the determined wavefronts. These further sensors are e.g. air pressure sensors, sensors for measuring the temperature in the lens or sensors which measure the temperature on lens elements or on the rear side of mirrors.

The manipulators 121, 122, 123 can be controlled by a regulation unit 130.

The regulation unit 130 can be used to obtain upper limits and manipulator specifications from a memory 140 and also information in respect of the measured aberrations or wavefronts from the determination unit 150.

In contrast to DE102008042356A1, the regulation unit 130 contains a first adjustment unit 132 and a second adjustment unit 133, which regulate or control the first and the second partial adjustment, respectively, and a lookup table 131, which provides information in respect of the subdivision of the determined aberrations into relatively slow and relatively quick aberrations and which contains information in respect of the relatively slow manipulators to be used for the first partial adjustment and of the relatively quick manipulators to be used for the second partial adjustment.

FIG. 6 illustrates the principle of the parallel first partial adjustment and second partial adjustment.

The wavefront errors or aberrations are established by the determination unit 150 in a first step 201. They are subsequently, via a lookup table 131, subdivided in a second step 202 into two classes of quickly changing aberrations $b_1$ and slowly changing aberrations $b_2$ respectively relative to one another. In parallel with this, the manipulators are subdivided into the classes of relatively slow and relatively quick manipulators according to a further lookup table, which is likewise denoted by 131. The next steps 203 and 204 are carried out in parallel: step 203 denotes the first partial adjustment, in which the relatively quickly changing aberrations $b_1$ are adjusted by the relatively quick manipulators, and step 204 denotes the second partial adjustment, in which the relatively slowly changing aberrations $b_2$ are adjusted by the relatively slow manipulators. Here, step 203 is carried out repeatedly, wherein, after each run through, the quickly changing aberrations are re-measured in an additional step 205 by the determination unit 150 or, for reasons of a tightly allocated first adjustment time $t_1$, predicted by the determination unit 150. By way of example, this prediction can be undertaken by a model which is calibrated automatically.

The totality of steps 201-205 can likewise be carried out repeatedly once the second partial adjustment has been completed after the second adjustment time $t_2$.

The invention claimed is:

1. A method of adjusting a microlithographic projection exposure apparatus comprising a projection lens, the method comprising:
   performing a first partial adjustment which comprises:
      prescribing a first temporal adjustment duration $t_1$;
      establishing a first aberration $b_1$ of the projection lens;
      adjusting $b_1$ during $t_1$; and
   performing a second partial adjustment which comprises:
      prescribing a second temporal adjustment duration $t_2$,
      establishing a second aberration $b_2$ of the projection lens,
      adjusting $b_2$ during $t_2$,
   wherein:
      $t_1 < t_2$;
      $b_1$ changes more quickly than $b_2$ during $t_2$;

$b_1$ and $b_2$ are scalar aberrations;

$b_1$ has a lower waviness than $b_2$; and the first partial adjustment is performed in parallel with the second partial adjustment.

2. The method of claim 1, comprising performing the first partial adjustment repeatedly while performing the second partial adjustment.

3. The method of claim 2, wherein:

the projection exposure apparatus comprises a plurality of manipulators comprising one or more manipulators of a first class of manipulators and one or more manipulators of a second class of manipulators;

the one or more manipulators in the first class of manipulators are quicker manipulators than the one or more manipulators in the second class of manipulators; and the method comprises:

using the one or more manipulators of the first class of manipulators during the first partial adjustment; and using one or more manipulators of a class of the second manipulators of the manipulators during the second partial adjustment.

4. The method of claim 3, comprising using equivalent manipulators in terms of design during the first and second partial adjustments.

5. The method of claim 4, comprising using equivalent thermal manipulators in terms of design during the first and second partial adjustments.

6. The method of claim 5, comprising using a manipulator with a greater accuracy setting during the second partial adjustment than during the first partial adjustment.

7. The method of claim 1, wherein $t_1 < 100$ milliseconds, and $t_2$ is at least twice $t_1$.

8. The method of claim 1, comprising:

using a first algorithm to determine manipulator travel for the first partial adjustment; and using a second algorithm to determine manipulator travel for the second partial adjustment, wherein the first algorithm has a quicker run time than the second algorithm.

9. The method of claim 1, comprising:

using a first algorithm to determine manipulator travel for the first partial adjustment; and using a second algorithm to determine manipulator travel for the second partial adjustment, wherein the first algorithm has a lower accuracy than the second algorithm.

10. The method of claim 1, using a measurement to establish at least one aberration selected from the group consisting of $b_1$ and $b_2$.

11. The method of claim 1, using a prediction based on a prediction model to establish at least one aberration selected from the group consisting of $b_1$ and $b_2$.

12. The method of claim 11, comprising adjusting $b_1$ repeatedly while adjusting $b_2$.

13. The method of claim 12, wherein:

the projection exposure apparatus comprises a plurality of manipulators comprising one or more manipulators of a first class of manipulators and one or more manipulators of a second class of manipulators;

the one or more manipulators in the first class of manipulators are quicker manipulators than the one or more manipulators in the second class of manipulators; and the method comprises:

using the one or more manipulators of the first class of manipulators while adjusting $b_1$; and using one or more manipulators of a class of the second manipulators of the manipulators while adjusting $b_2$.

14. The method of claim 13, wherein $t_1 < 100$ milliseconds, and $t_2$ is at least twice $t_1$.

15. A method, comprising:

adjusting a first aberration $b_1$ of a projection lens of a microlithographic projection exposure apparatus during a first temporal adjustment duration $t_1$; and simultaneously adjusting a second aberration $b_2$ of the projection lens of the microlithographic projection exposure apparatus during a second temporal adjustment duration $t_2$, wherein:

$t_1 < t_2$;

during $t_2$, $b_1$ changes more quickly than $b_2$;

the method comprises:

using a first algorithm to determine manipulator travel for adjusting $b_1$; and using a second algorithm to determine manipulator travel for adjusting $b_2$; and the first algorithm has a quicker run time than the second algorithm, and/or the first algorithm has a lower accuracy than the second algorithm.

16. The method of claim 15, using a measurement to establish at least one aberration selected from the group consisting of $b_1$ and $b_2$, and/or using a prediction based on a prediction model to establish at least one aberration selected from the group consisting of $b_1$ and $b_2$.

17. A method of adjusting a microlithographic projection exposure apparatus comprising a projection lens, the method comprising:

performing a first partial adjustment which comprises:

prescribing a first temporal adjustment duration $t_1$;

establishing a first aberration $b_1$ of the projection lens;

adjusting $b_1$ during $t_1$; and performing a second partial adjustment which comprises:

prescribing a second temporal adjustment duration $t_2$, establishing a second aberration $b_2$ of the projection lens, adjusting $b_2$ during $t_2$, wherein:

$t_1 < t_2$;

$b_1$ changes more quickly than $b_2$ during $t_2$;

the first partial adjustment is performed in parallel with the second partial adjustment; and the method comprises using equivalent manipulators in terms of design during the first and second partial adjustments.

18. A method of adjusting a microlithographic projection exposure apparatus comprising a projection lens, the method comprising:

performing a first partial adjustment which comprises:

prescribing a first temporal adjustment duration $t_1$;

establishing a first aberration $b_1$ of the projection lens;

adjusting $b_1$ during $t_1$; and performing a second partial adjustment which comprises:

prescribing a second temporal adjustment duration $t_2$, establishing a second aberration $b_2$ of the projection lens, adjusting $b_2$ during $t_2$, wherein:

$t_1 < t_2$;

$b_1$ changes more quickly than $b_2$ during $t_2$;

the first partial adjustment is performed in parallel with the second partial adjustment;

the method comprises:

using a first algorithm to determine manipulator travel for the first partial adjustment; and using a second algorithm to determine manipulator travel for the second partial adjustment; and the first algorithm has a quicker run time than the second algorithm, and/or the first algorithm has a lower accuracy than the second algorithm.

19. The method of claim 18, wherein the first algorithm has a quicker run time than the second algorithm.

20. The method of claim 18, wherein the first algorithm has a lower accuracy than the second algorithm.

* * * * *

UNITED STATES PATENT AND TRADEMARK OFFICE
CERTIFICATE OF CORRECTION

PATENT NO. : 9,829,800 B2
APPLICATION NO. : 14/573126
DATED : November 28, 2017
INVENTOR(S) : Boris Bittner et al.

Page 1 of 1

It is certified that error appears in the above-identified patent and that said Letters Patent is hereby corrected as shown below:

In the Specification

Column 6, Line 26, delete "4" and insert -- $t_1$ --.
Column 7, Line 54, delete "an a" and insert -- a --.
Column 8, Line 9, delete "accurancy." and insert -- accuracy. --.
Column 8, Line 30, delete "FIG." and insert -- FIGS. --.
Column 8, Line 32, delete "FIG." and insert -- FIGS. --.

Signed and Sealed this
Eighth Day of May, 2018

Andrei Iancu
*Director of the United States Patent and Trademark Office*